United States Patent [19]

Tregilgas et al.

[11] Patent Number: 5,079,192
[45] Date of Patent: Jan. 7, 1992

[54] METHOD OF PREVENTING DISLOCATION MULTIPLICATION OF BULK HGCDTE AND LPE FILMS DURING LOW TEMPERATURE ANNEAL IN HG VAPOR

[75] Inventors: John H. Tregilgas; Dipankar Chandra, both of Richardson, Tex.

[73] Assignee: Texas Instruments Incorporated, Dallas, Tex.

[21] Appl. No.: 573,515

[22] Filed: Aug. 24, 1990

[51] Int. Cl.$^5$ .................................. H01L 21/324
[52] U.S. Cl. .................................. 437/248; 437/247; 148/DIG. 64
[58] Field of Search ............... 437/248, 965, 949; 148/DIG. 64, DIG. 22, DIG. 71; 156/620.2, DIG. 72, DIG. 82

[56] References Cited

U.S. PATENT DOCUMENTS

| 4,374,684 | 2/1983 | Micklethwaite | 148/13.1 |
| 4,481,044 | 11/1984 | Schaake et al. | 437/247 |
| 4,504,334 | 3/1985 | Schaake et al. | 437/965 |
| 4,642,142 | 2/1987 | Harman | 148/DIG. 64 |
| 4,648,917 | 3/1987 | Kay et al. | 437/965 |
| 4,950,621 | 8/1990 | Irvine et al. | 148/DIG. 64 |
| 4,960,728 | 10/1990 | Schaake et al. | 148/DIG. 64 |

Primary Examiner—Brian E. Hearn
Assistant Examiner—C. Chaudhari
Attorney, Agent, or Firm—Melvin Sharp; James T. Comfort; N. Rhys Merrett

[57] ABSTRACT

The disclosure relates to a method of forming samples of alloys of group II-VI compositions having minimum dislocations, comprising the steps of providing a sample of a group II-VI compound, providing an enclosed ampoule having the sample at one end portion thereof and a group II element of the compound at an end portion remote from the one end portion, heating the sample to a temperature in the range of 350 to the melting temperature of the compound for about one hour while maintaining the group II element at a temperature more than 200° C. below the sample temperature, heating the group II element to a temperature from about 5° to about 50° C. below the temperature of the sample while maintaining the sample at a temperature in the range of 350° to 650° C. both of about 15 minutes to about 4 hours, and then stoichiometrically annealing the sample at a temperature below 325° C.

16 Claims, 1 Drawing Sheet

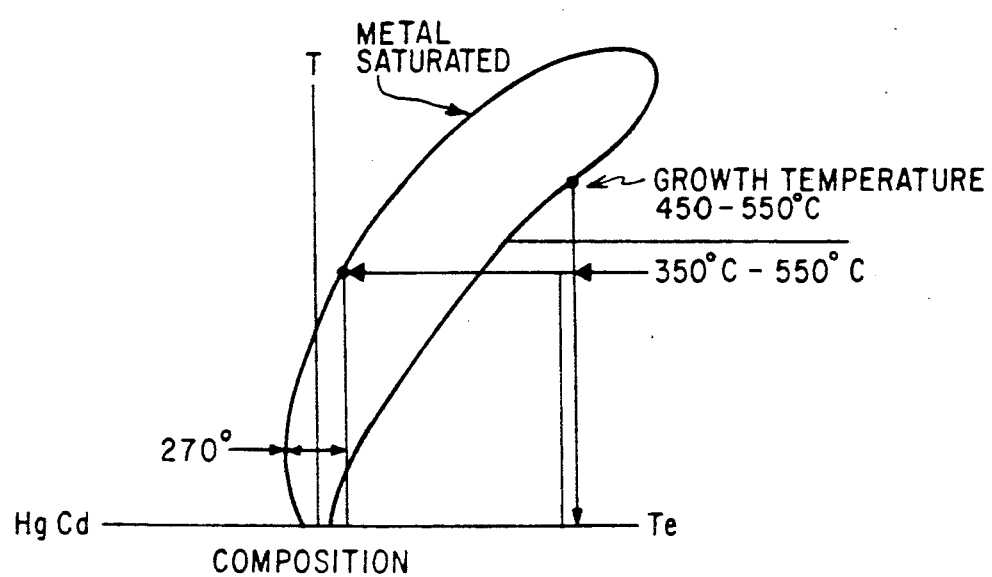

METHOD OF PREVENTING DISLOCATION MULTIPLICATION OF BULK HGCDTE AND LPE FILMS DURING LOW TEMPERATURE ANNEAL IN HG VAPOR

BACKGROUND OF THE INVENTION

1. Field of the Invention

This invention relates to formation of semiconductor grade bulk HgCdTe.

2. Brief Description of the Prior Art

Precipitation of tellurium can occur during cooling of tellurium-rich HgCdTe. Tellurium precipitates form initially on dislocations and within the matrix. Dislocations act as heterogeneous nucleation sites for the formation of tellurium precipitates and precipitates may also form in the HgCdTe matrix between dislocations. When the bulk HgCdTe is subsequently annealed at low temperatures of about 270° C. in a saturated Hg vapor to convert it from p-type (Te-rich) to n-type, a high dislocation density due to dislocation multiplication generally results. This defect multiplication results from a volume expansion at tellurium precipitates on dislocations when interstitial mercury combines with the tellurium to form HgTe according to the equation:

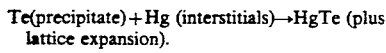
Te(precipitate) + Hg (interstitials) → HgTe (plus lattice expansion).

Since the excess volume must be accommodated, the lattice is plastically deformed by this excess volume and expands to create more defects. See, for example the article of H. F. Schaake et al., Journal of Electronic Materials, Vol. 6, page 931 (1983).

Dislocations are known to be electrically active and can contribute to increased recombination in HgCdTe and dark currents in MIS devices, however they have also been blamed for having a negative influence on the electrical and other characteristics of semiconductor devices and degrade performance thereof. A discussion of this is set forth in "A Discussion of the Impact of Dislocations on Electrical Properties of HgCdTe", J. H. Tregilgas et al., Journal of Crystal Growth, 86 (1988), pp 460–466.

A prior method for circumventing dislocation multiplication in bulk Te-saturated HgCdTe is set forth in U.S. Pat. No. 4,481,044 of Schaake et al. wherein the amount of tellurium on the dislocations is reduced by high temperature annealing at about 600° C. in a mercury saturated ambient. Removal of tellurium on dislocations prior to low temperature annealing in mercury vapor prevents dislocation multiplication. In accordance with the procedure in this patent, a slice or ingot of HgCdTe is placed in one side of an enclosed ampoule and mercury is placed at the other end of the ampoule. The temperature at the HgCdTe end of the ampoule is maintained at about 600° C. whereas the temperature at the mercury end of the ampoule is maintained at about 550° C. to anneal the HgCdTe to allow mercury to enter into the HgCdTe and change the composition thereof. The HgCdTe is then post-annealed below 325° C. in a mercury saturated atmosphere and allows additional mercury to enter therein to further change the composition of the HgCdTe. The result is n-type HgCdTe whereas the starting material is filled with metal vacancies. This method does not provide suitable results when used to reduce dislocations in thin films, such as those formed by liquid phase epitaxy (LPE) from Te-rich solutions.

A common problem encountered in slice dislocation reduction annealing (DRA) processing of bulk HgCdTe and liquid phase epitaxially (LPE) deposited HgCdTe films is that dislocation multiplication can occur during heating from room temperature in the presence of liquid mercury if tellurium precipitates are present at dislocation lines. This problem has been observed in bulk material by a graded dislocation density near the surface of the slice extending several mils into the material as noted in the above Tregilgas article. In the case of LPE grown films which are typically less than 150 micrometers in thickness, dislocation multiplication may occur extensively throughout the film, raising the dislocation density by a factor of two or more.

It is desired to find a procedure whereby the defect multiplication problem of the prior art can be circumvented in thin films such as those formed by LPE without the problems encountered in the prior art.

SUMMARY OF THE INVENTION

LPE films of group II-VI compound are generally grown on a substrate, such as, for example, CdTe, CdZnTe, ZnTe and other group II-VI compounds at temperatures of from about 450° C. to about 550° C. In order to prevent the problem of dislocation multiplication in the LPE grown films or in samples in general of group II-VI compounds, for example, $Hg_{(1-x-y)}Cd_xZn_yTe$ on a standard substrate therefor, where x can vary from 0 to 1 and y can vary from 0 to 1, and in accordance with the present invention, the samples are initially heated to a suitable dislocation reduction annealing (DRA) temperature in the range of from about 350° to about 650° C. and preferably about 400° C. while being held near the Te-rich side of the Te-Hg,Cd phase diagram in the presence of a low temperature mercury reservoir in the case of a Hg-containing group II-VI compound and then increasing the temperature of the mercury reservoir to reduce the excess tellurium at dislocations and move stoichiometric composition of the HgCdTe to the metal saturated side of the phase diagram.

The above is accomplished by utilizing a two-zone furnace to independently heat the HgCdTe LPE sample and the mercury reservoir. The LPE film is initially encapsulated in a long ampoule and at one end thereof with enough Hg for a saturated mercury atmosphere disposed at the other end of the ampoule. The sample is heated to the dislocation reduction annealing temperature in the range of from about 350° C. to about 650° C. and preferably 400° C. while the furnace zone containing the Hg is held at a low temperature so as to produce Hg vapor pressure over the HgCdTe which is about the same as the Hg vapor pressure over the Te saturated HgCdTe at the dislocation reduction annealing temperature (i.e., the Hg temperature is less than about 200° C.). After the sample is annealed at, for example, 400° C. for about 15 minutes to about 4 hours and preferably one hour, the mercury reservoir is heated to a temperature in the range of from about 5° C. to about 50° C. below the temperature of the sample. The mercury temperature is maintained below the sample temperature to prevent the mercury from depositing on and dissolving the sample. The HgCdTe sample and mercury are maintained at these temperatures for about 15 minutes to about 4 hours, depending upon the film thickness (e.g., 20 to 100 microns), the mercury diffusivity and the tellurium content thereof to reach the equilibrium point with mercury. The sample is then cooled and stoichiometric annealing below 325° C. for from several hours to several days. Use of such an anneal eliminates the excess tellurium which causes dislocation multiplication during the post-anneal in saturated mercury vapor below 325° C.

Temperatures as high as about 650 degrees C. can be used for this process, but correspondingly higher mercury reservoir temperatures must also be employed. The initial temperature of the Hg reservoir needed to establish an equilibrium vapor pressure over Te saturated HgCdTe can be determined from published papers by R. F. Brebrick et al., Journal of Physical Chemistry Solids, 26, 989 (1965) and T. Tung et al., Journal of the Electrochemical Society, 128, 451 (1981).

While the preferred embodiments described herein relate to HgCdTe and HgCdZnTe with heating of the sample taking place in a Hg-saturated atmosphere, it should be understood that this invention relates to any group II-VI compound with initial heating of the sample in an atmosphere deficient of the group II element or elements of the compound and the atmosphere then being saturated with a group II element of the compound for the remainder of the heating period.

BRIEF DESCRIPTION OF THE DRAWING

FIG. 1 shows the HgCdTe system on a phase diagram.

DESCRIPTION OF THE PREFERRED EMBODIMENT

EXAMPLE 1

A sample was provided having a $Hg_xCd_{1-x}Te$ film grown on a substrate, where x can vary from 0 to 1. In order to prevent the problem of dislocation multiplication in the LPE grown film, the film is initially heated to a dislocation reduction annealing (DRA) temperature of 400° C. while being held near the Te-rich side of the Te-Hg,Cd phase diagram and then an increased mercury pressure is provided to reduce the excess tellurium at dislocations.

The above is accomplished by utilizing a two-zone furnace to independently heat the HgCdTe LPE sample and the mercury reservoir. The LPE film is initially encapsulated in a long ampoule and at one end thereof with enough mercury within the ampoule to provide a saturated mercury atmosphere, the mercury being disposed at the other end of the ampoule. The sample is heated to the dislocation reduction annealing temperature in the range of 400° C. while the furnace zone containing the mercury is held at a low temperature (i.e., less than 200° C.). After the sample is annealed at 400° C. for about an hour, the mercury reservoir is heated to a temperature of 390° C. The HgCdTe sample and mercury are maintained at these temperatures for about 1 hour. The sample is then cooled and stoichiometric annealed below 325° C. for several hours to several days. The sample is then cooled to room temperature.

In accordance with the above procedure, dislocation multiplication in thin films of groups II-VI materials, such as, for example, LPE HgCdTe grown from a Te-rich melt is substantially prevented.

EXAMPLE 2

A sample was provided having a $Hg_{(1-x-y)}Cd_xZn_yTe$ LPE film grown on a substrate, where x can vary from 0 to 1 and y can vary from 0 to 1. In order to prevent the problem of dislocation multiplication in the LPE grown film, the film is initially heated to a dislocation reduction annealing (DRA) temperature of 400° C. while being near the Te-rich side of the Te-Hg,Cd phase diagram and then an increased mercury pressure is provided to reduce the excess tellurium at dislocations.

The above is accomplished by utilizing a two-zone furnace to independently heat the HgCdTe LPE sample and the mercury reservoir. The LPE film is initially encapsulated in a long ampoule and at one end thereof with enough mercury within the ampoule to provide a saturated mercury atmosphere, the mercury being disposed at the other end of the ampoule. The sample is heated to the dislocation reduction annealing temperature in the range of 400° C. while the furnace zone containing the mercury is held at a low temperature (i.e., less than 200° C.). After the sample is annealed at 400° C. for about an hour, the mercury reservoir is heated to a temperature of 390° C. The HgCdTe sample and mercury are maintained at these temperatures for about 1 hour. The sample is then cooled and stoichiometric annealed below 325° C. for several hours to several days. The sample is then cooled to room temperature.

In accordance with the above procedure, dislocation multiplication in thin films of groups II-VI material, such as, for example, LPE HgCdTe grown from a Te-rich melt is substantially prevented.

Through the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. A method of processing alloys of group II-VI compound semiconductors having minimum dislocations, comprising the steps of:
   (a) providing a sample of a group II-VI compound,
   (b) heating the sample to a temperature in a range of from about 350° to about 650° C. for about one hour in an atmosphere deficient of a group II element or elements,
   (c) saturating the atmosphere about said heated sample with at least one of said group II elements,
   (d) maintaining the heated sample in the group II-saturated atmosphere for from about 15 minutes to about 4 hours, and
   (e) then stoichiometrically annealing said sample at a temperature below 325° C.

2. The method of claim 1 wherein said group II-VI compound is Hg-containing and said atmosphere in step (b) is Hg deficient.

3. The method of claim 2 wherein said Hg-containing compound is HgCdTe.

4. The method of claim 2 wherein said Hg-containing compound is HgCdZnTe.

5. The method of claim 1 wherein said temperature in step (b) is about 400° C.

6. The method of claim 2 wherein said temperature in step (b) is about 400° C.

7. The method of claim 3 wherein said temperature in step (b) is about 400° C.

8. The method of claim 4 wherein said temperature in step (b) is about 400° C.

9. A method of forming thin films of alloys of group II-VI compounds having minimum dislocations, comprising the steps of:
(a) providing a sample of a group II-VI compound;
(b) providing an enclosed ampoule having said sample at one end portion thereof and a group II element of said compound at an end portion remote from said one end portion in an atmosphere deficient of the group II element;
(c) heating said sample to a temperature in the range of from about 350 to the melting temperature of said compound for about one hour while maintaining said group II element at a temperature more than 200° C. below the sample temperature,
(d) heating said group II element to a temperature from about 5° to about 50° C. below the temperature of said sample while maintaining said sample at a temperature in the range of 350° to 550° C. both for about 15 minutes to about 4 hours, and
(e) then stoichiometrically annealing said sample at a temperature below 325° C.

10. The method of claim 9 wherein said group II-VI compound is Hg-containing and said atmosphere in step (b) is Hg deficient.

11. The method of claim 10 wherein said Hg-containing compound is HgCdTe.

12. The method of claim 10 wherein said Hg-containing compound is HgCdZnTe.

13. The method of claim 9 wherein said temperature in step (c) is about 400° C.

14. The method of claim 10 wherein said temperature in step (c) is about 400° C.

15. The method of claim 11 wherein said temperature in step (c) is about 400° C.

16. The method of claim 12 wherein said temperature in step (c) is about 400° C.

* * * * *